(12) United States Patent
Kubo

(10) Patent No.: US 8,134,078 B2
(45) Date of Patent: Mar. 13, 2012

(54) FLEXIBLE WIRING CABLE

(75) Inventor: Tomoyuki Kubo, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 1022 days.

(21) Appl. No.: 12/037,924

(22) Filed: Feb. 26, 2008

(65) Prior Publication Data

US 2008/0202797 A1    Aug. 28, 2008

(30) Foreign Application Priority Data

Feb. 27, 2007  (JP) ................................. 2007-047480

(51) Int. Cl.
*H05K 1/00*    (2006.01)
(52) U.S. Cl. ........ 174/254; 174/262; 174/263; 174/264; 174/268; 361/826; 360/245.8; 360/245.9
(58) Field of Classification Search .................. 174/254, 174/262, 263, 264, 268; 361/479, 826; 360/245.8, 360/245.9
See application file for complete search history.

(56) References Cited

U.S. PATENT DOCUMENTS

| | | | |
|---|---|---|---|
| 6,603,071 B2 | 8/2003 | Takao | |
| 7,773,386 B2 * | 8/2010 | Yamashita et al. | 361/749 |
| 2004/0233641 A1 * | 11/2004 | Moshayedi | 361/716 |
| 2005/0253488 A1 | 11/2005 | Ito | |

FOREIGN PATENT DOCUMENTS

| | | |
|---|---|---|
| JP | 200283845 A | 3/2002 |
| JP | 2005322850 A | 11/2005 |
| JP | 2007007955 A | 1/2007 |

* cited by examiner

*Primary Examiner* — Jayprakash N Gandhi
*Assistant Examiner* — Dion Ferguson
(74) *Attorney, Agent, or Firm* — Baker Botts L.L.P.

(57) ABSTRACT

A plurality of first output terminals is provided along one side of a circuit element, and a plurality of input terminals and a plurality of second output terminals are provided adjacently along the other opposite side thereof. Leads include a first output lead extending from the first output terminal to an output connection electrode, and a second output lead extending from the second output terminal to the output connection electrode. The second output lead is extended from the other side of the circuit element to one side of the circuit element through a surface of a flexible wiring cable opposite the circuit element and further extended in parallel with the first output lead and connected to the output connection electrode.

4 Claims, 9 Drawing Sheets

F I G. 4
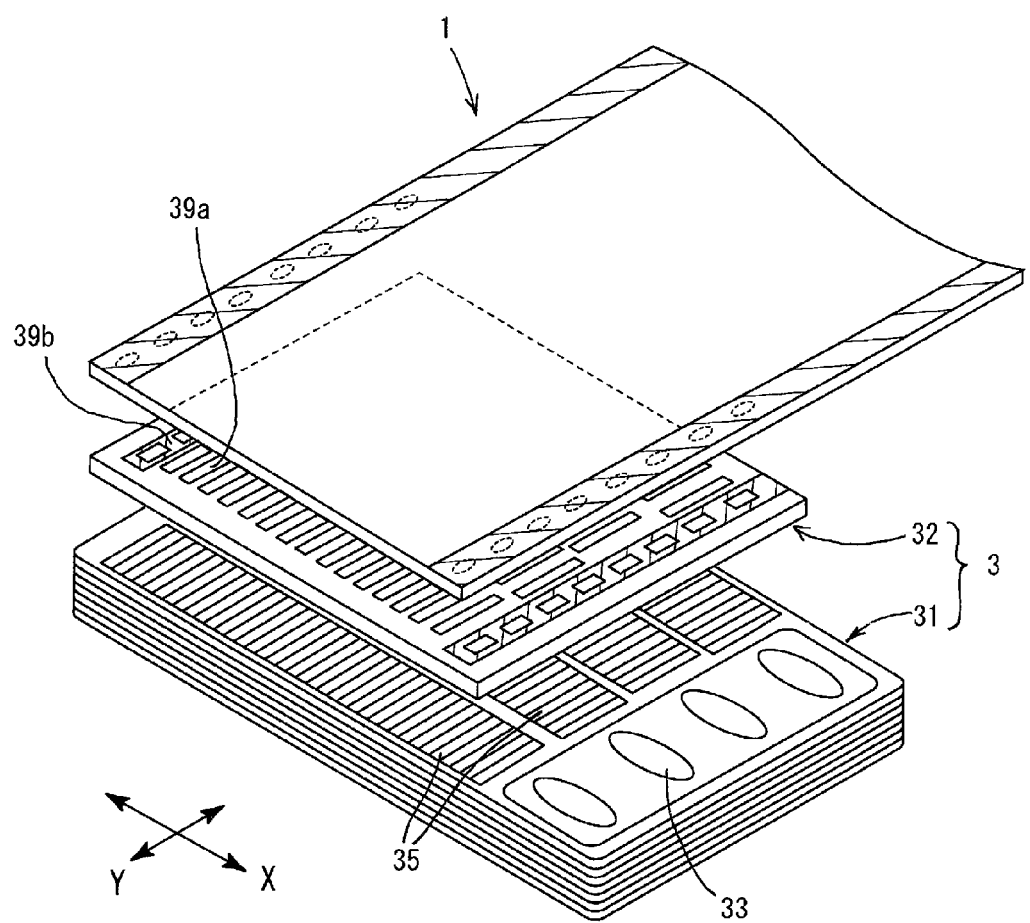

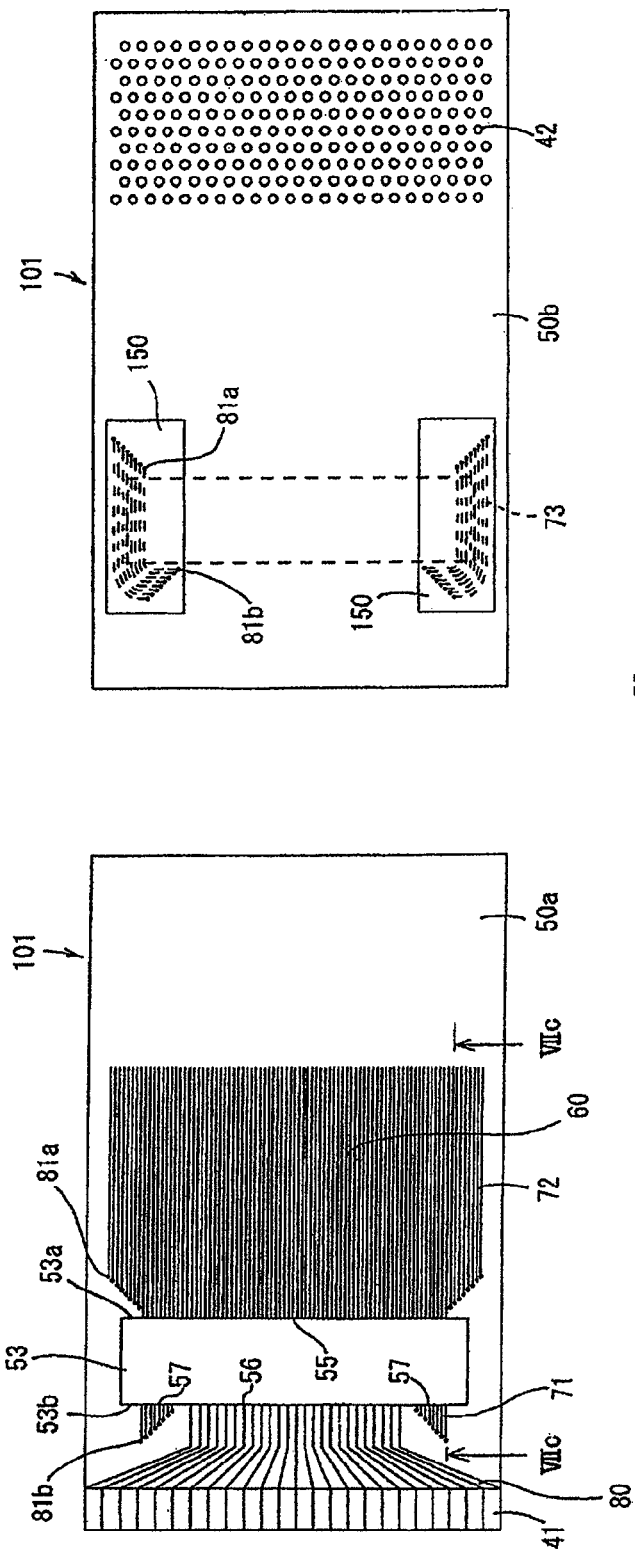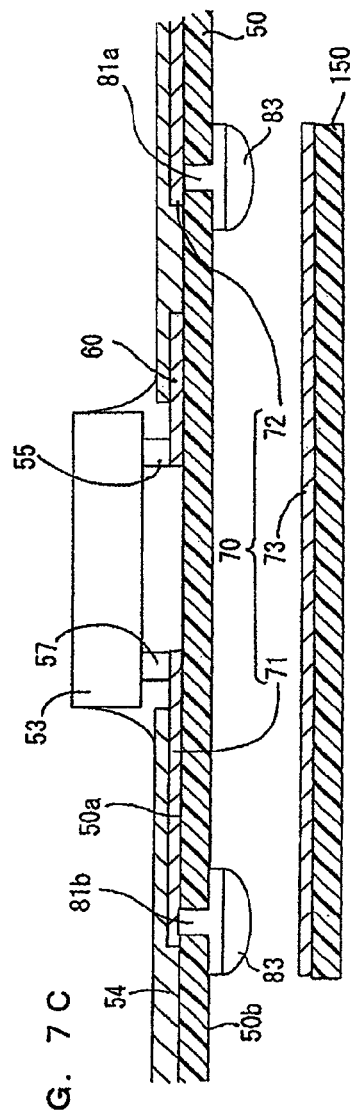

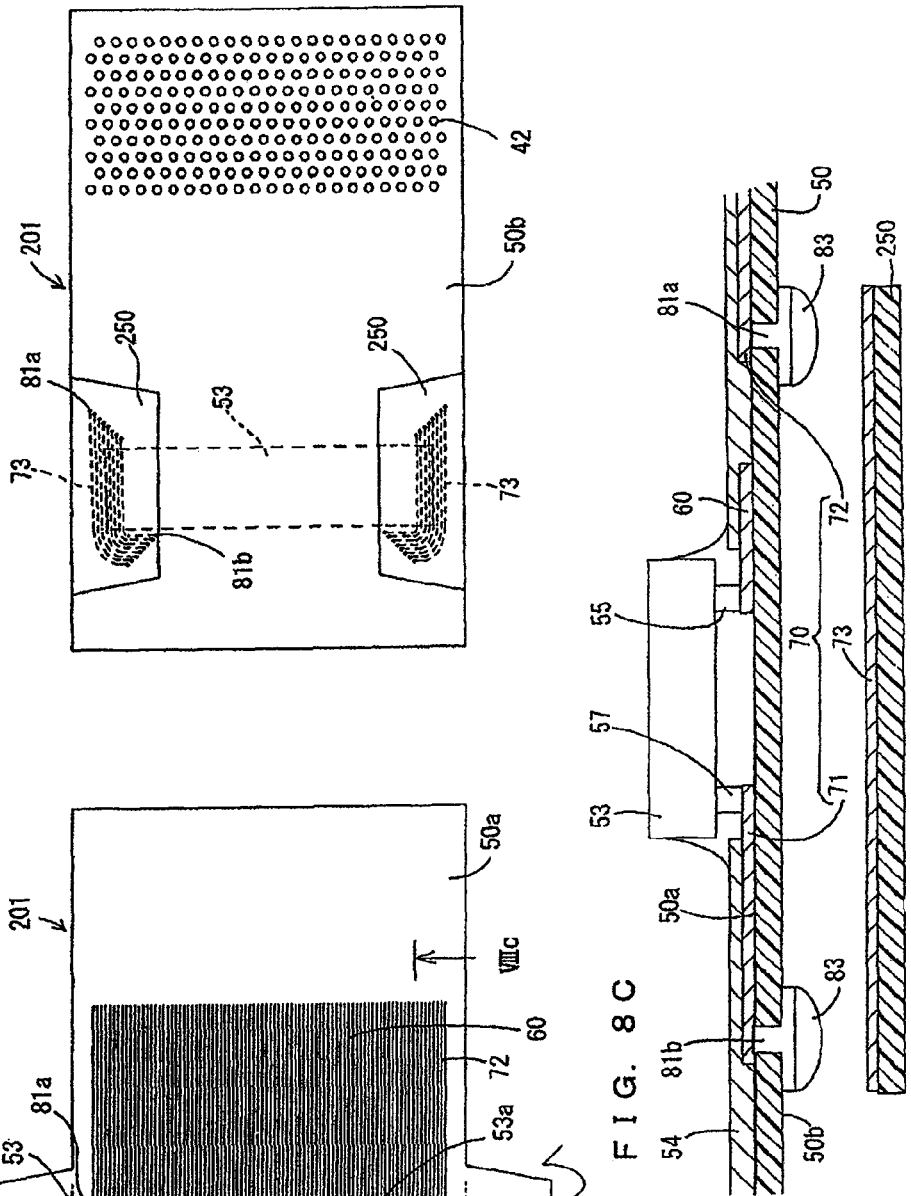

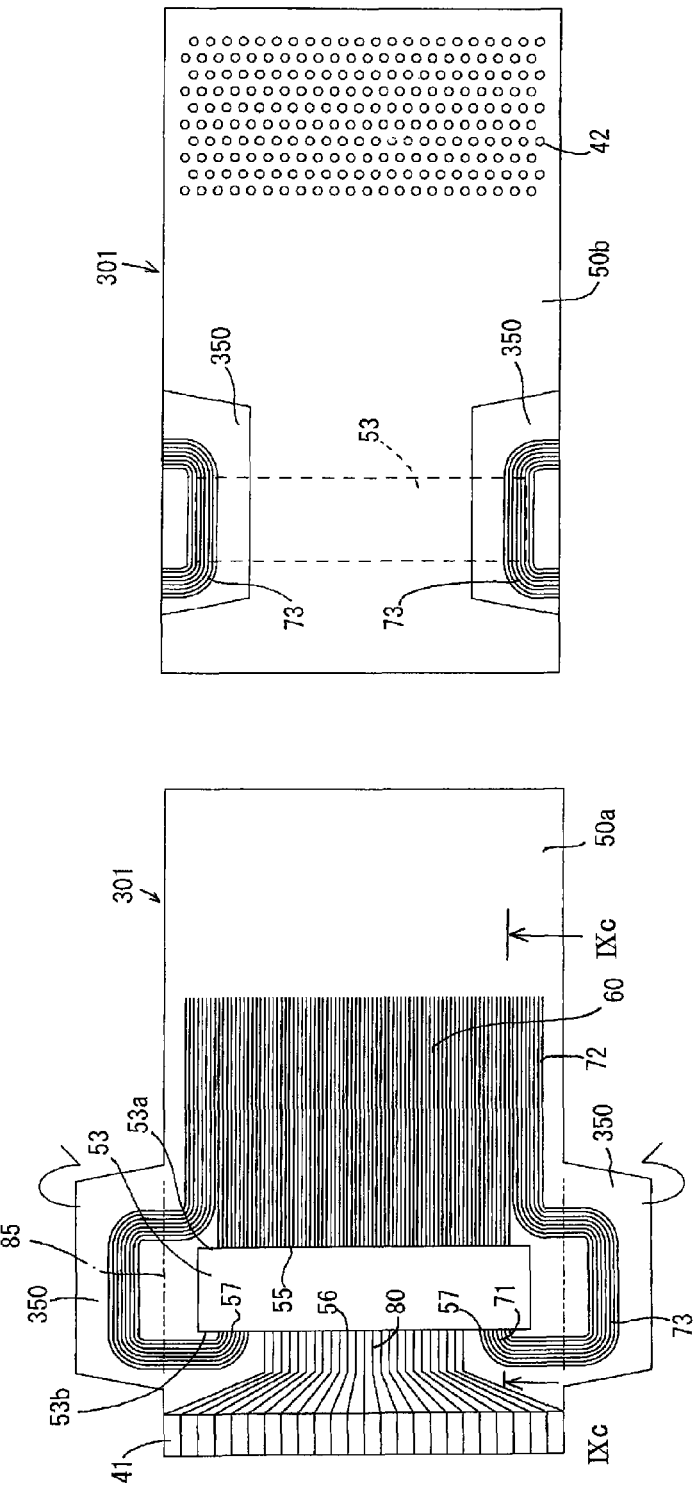

FLEXIBLE WIRING CABLE

CROSS-REFERENCE TO RELATED APPLICATION

This Nonprovisional application claims priority under 35 U.S.C. §119(a) on Patent Application No. 2007-47480 filed in Japan on Feb. 27, 2007, the entire contents of which are hereby incorporated by reference.

BACKGROUND

The present invention relates to a flexible wiring cable on which a circuit element is mounted.

As the flexible wiring cable mounted with the circuit element, a wiring cable or the like for transmitting a drive signal based on print data to an actuator of a recording head discharging ink is known, for example. As for the recording head, a structure including a cavity part having many nozzles and an ink supply path, and an actuator having an active part corresponding to each nozzle is disclosed in Japanese Patent Application Laid-Open No. 2007-7955, for example. Thus, the actuator and an external signal source are connected by the flexible wiring cable mounted with the circuit element.

More specifically, an output lead extending from an output terminal of the circuit element is connected to each of many active parts of the actuator. Each active part is changed independently based on a drive signal transmitted from an external signal source through the circuit element. Thus, when the active part is changed, a discharging pressure is applied to the ink in the cavity part, so that ink is discharged selectively from each nozzle.

Meanwhile, according to a recent recording head, the number of nozzles discharging the ink tends to be increased and the number of active parts of the actuator tends to be increased as a recording density and a recording speed become high. Therefore, it is necessary to increase the output terminal and output lead of the circuit element. In order to increase them, a wiring pitch of the lead is to be narrowed and the size of the circuit element itself is to be enlarged, but there is a limit to it.

FIG. 1 is a plan view showing a conventional flexible wiring cable 401 disclosed in Japanese Patent Application Laid-Open No. 2002-83845. An output terminal 55 is provided at one side 53a of a circuit element 53, and the output terminal 55 is connected to an output connection electrode 42 through an output lead 60. In addition, an output terminal 57 is provided at both ends of the other side 53b of the circuit element 53, and the output terminal 57 is connected to the output connection electrode 42 through an output lead 70. In addition, an input terminal 56 is provided at the center of the other side 53b of the circuit element 53, and the input terminal 56 is connected to an input connection electrode 41 through an input lead 80.

Although a circuit element has an output terminal along a side closer to the output side of a flexible wiring cable and has an input terminal along a side closer to the input side of the flexible wiring cable in general, according to the conventional flexible wiring cable 401 shown in FIG. 1, the output terminal is provided along not only the side 53a on the output side but also the side 53b on the input side in the circuit element 53, so that the input terminal 56 and the output terminal 57 are adjacently provided along the side 53b on the input side.

SUMMARY

Thus, in a case where the output terminal 57 is provided along the side 53b on the input side of the circuit element 53, when the output lead 70 from the output terminal 57 is pulled out to the output side (output connection electrode 42) of the flexible wiring cable 401, it has to be wired around the circuit element 53. In this case, according to the conventional example, both side edges of the flexible wiring cable 401 is elongated by $\Delta W$ in the vicinity of the circuit element 53 partially, and the output lead 70 is partially wired on this elongated region as shown in FIG. 1. However, in this case, since the width of the flexible wiring cable 401 is enlarged and becomes large, the problem is that there is inconvenience in arrangement of the flexible wiring cable 401.

An object is to provide a flexible wiring cable mounting a circuit element and keeping its size small even when the number of output terminals of the circuit element is increased and the output terminal is arranged on an input side as well as an output side of the circuit element.

A flexible wiring cable of a first aspect has a plurality of leads in the form of a plane, a circuit element mounted on the leads, an input connection electrode formed on one end, and an output connection electrode formed on the other end, in which a plurality of first output terminals ate provided along one side of the circuit element, and a plurality of input terminals and a plurality of second output terminals are adjacently provided along the other side of the circuit element, the leads include a first output lead extending from the first output terminal to the output connection electrode, a second output lead extending from the second output terminal to the output connection electrode, and an input lead extending from the input connection electrode to the input terminal, and the second output lead is extended from the other side of the circuit element to one side of the circuit element through the opposite side of the circuit element of the flexible wiring cable, further extended in parallel with the first output lead, and connected to the output connection electrode.

According to the flexible wiring cable of the first aspect, since the mounted circuit element includes the first output terminal along its one side and the second output terminal along the other side, it can correspond to a load having many drive parts. Thus, when the first output terminal and the second output terminal are connected to the output connection electrode at the same end, since the second output lead connecting the second output terminal to the output connection electrode is extended from the other side of the circuit element to one side thereof through the opposite surface of the circuit element of the flexible wiring cable partially, the second output lead can be wired without increasing a plane area of the flexible wiring cable.

According to the flexible wiring cable of a second aspect, as set forth in the first aspect, the input terminals are arranged almost at the center of the other side of the circuit element, and the second output terminals are arranged at both sides of the input terminals on the other side of the circuit element. Since the second output terminals are arranged on both sides of the input terminals arranged at the center of the other side, even when the number of the second output leads extending from the second output terminals is increased, they are divided to both sides, so that the plane area of the flexible wiring cable is not increased.

According to the flexible wiring cable of a third aspect, as set forth in the first or second aspect, the input lead, the first output lead and the circuit element are provided on a flexible flat base, and the second output lead includes a part extending from the second output terminal of the circuit element on the base, a part positioned on the same side of the base as the first output lead and connected to the output connection electrode, and a part passing through the other surface of the base opposite the circuit element. The two parts of the second output lead are arranged on one surface side of the base on which the input lead, the first output lead and the circuit element are arranged, and one part of the second output lead is arranged on the other surface side of the base. That is, since the second output lead is divided into the three parts, only the middle part thereof can be arranged on the other surface side of the base.

According to the flexible wiring cable of a fourth aspect, as set forth in the third aspect, a conductive material penetrating the base is provided at both sides of the circuit element, and a first part of the second output lead positioned on one surface of the base, and a second part thereof passing on the other surface of the base opposite the circuit element are connected through the conductive material penetrating the base. Therefore, since it is not necessary to increase the plane area of the base when the lead on the one surface side of the base is connected to the lead on the other surface side thereof, compact connection can be implemented.

According to the flexible wiring cable of a fifth aspect, as set forth in the fourth aspect, the second part of the second output lead is printed on the other surface side of the base. Therefore, it is not necessary to add another member for wiring on the other surface side of the base.

According to the flexible wiring cable of a sixth aspect, as set forth in the fourth aspect, the second part of the second output lead is formed on an auxiliary base fixed to the other surface side of the base, and the auxiliary base is fixed to the other surface side of the base in such a state that the second part is connected to the penetrating conductive material. The second part of the second output lead is formed on the auxiliary base firmly fixed to the other surface side of the base and connected to the conductive material of the base. Thus, one part of the second output lead can be easily arranged on the opposite side of the circuit element.

According to the flexible wiring cable of a seventh aspect, as set forth in the sixth aspect, the auxiliary base is formed in succession on one surface side of the base and bent and fixed to the other surface side of the base. Although the base and the auxiliary base may be manufactured separately as different members, when the auxiliary base is continuously formed on one side of the base and bent toward the base, manufacturing can be easier.

According to the flexible wiring cable of an eighth aspect, as set forth in the third aspect, an auxiliary base formed in succession in an extending direction of both sides of the circuit element and bent toward the other surface side of the base is provided on one side of the base, and the second output lead is continuously formed from the second output terminal to the output connection electrode through the auxiliary base. Since the auxiliary base is formed in succession on the one side of the base and the second output lead is continuously formed from the second output terminal to the output connection electrode through the auxiliary base and then the auxiliary base is bent, the second output lead can be easily arranged through the opposite side of the circuit element partially.

According to the flexible wiring cable of a ninth aspect, as set forth in any one of the sixth to eighth aspects, when the auxiliary base is bent, a width of the base at a portion having the auxiliary base is almost the same as that at a portion not having the auxiliary base. Thus, since the flexible wiring cable has the same width as a whole, its arrangement space can be compact.

According to the flexible wiring cable of a tenth aspect, as set forth in any one of the first to ninth aspects, the output connection electrode is connected to an actuator of a recording head performing a recording operation by selective drive of the actuator. Thus, even when the number of the output terminals of the circuit element is increased according to the increase in the number of nozzles of the recording head, the flexible wiring cable does not become large.

The above and further objects and features of the invention will more fully be apparent from the following detailed description with accompanying drawings.

BRIEF DESCRIPTION OF THE SEVERAL VIEWS OF THE DRAWINGS

FIG. 4 is a perspective view showing a recording head and the flexible wiring cable;

FIGS. 7A and 7B are top and bottom views showing a flexible wiring cable according to a second embodiment;

FIG. 7C is a sectional view taken along line VIIc-VIIc of FIG. 7A;

FIGS. 8A and 8B are top and bottom views showing a flexible wiring cable according to a third embodiment;

FIG. 8C is a sectional view taken along line VIIIc-VIIIc of FIG. 8A;

FIGS. 9A and 9B are top and bottom views of a flexible wiring cable according to a fourth embodiment; and FIG. 9C is a sectional view taken along line IXc-IXc of FIG. 9A.

DETAILED DESCRIPTION OF THE EXEMPLARY EMBODIMENTS

An embodiment will be described with reference to the drawings hereinafter.

Figure 1:
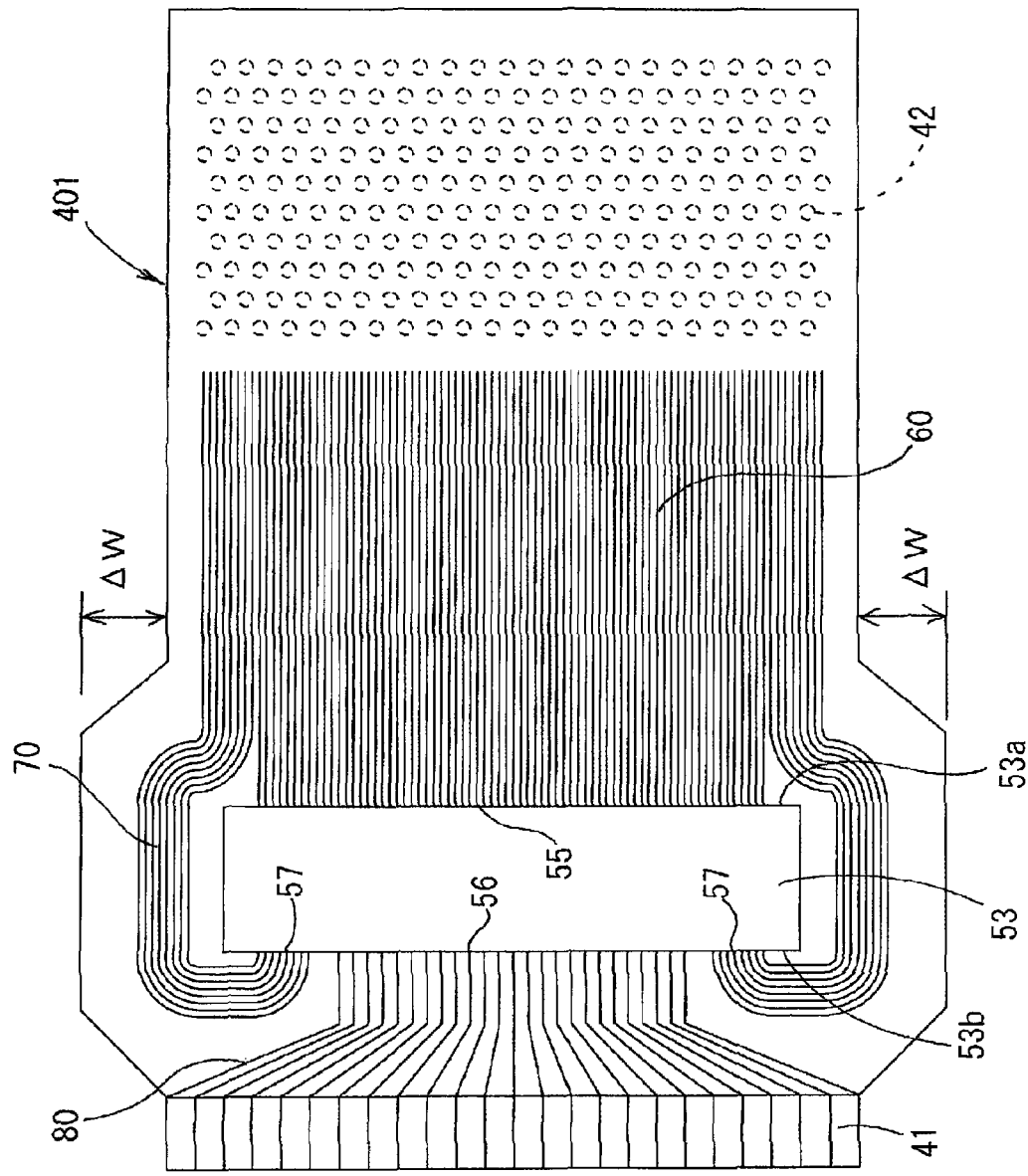
FIG. 1 is a plan view showing a conventional flexible wiring cable.
Figure 2:
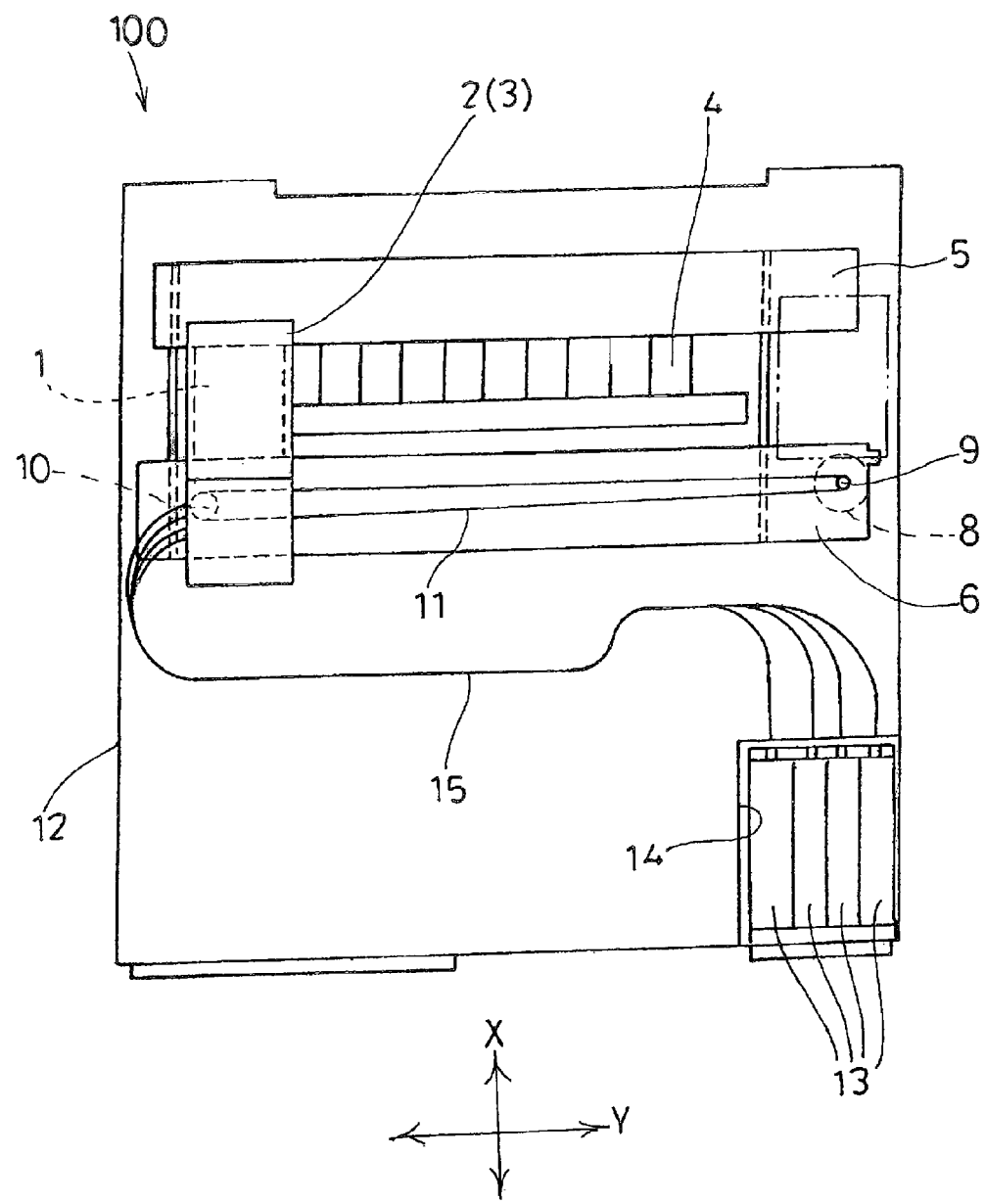
FIG. 2 is a schematic plan view showing a recording device including a flexible wiring cable.

FIG. 2 is a schematic plan view showing a recoding device 100 including a flexible wiring cable 1 of the embodiment on which a circuit element is mounted. This recording device 100 may be used in a single printer or may be used as a printer function (recording part) in a multifunctional device having a plurality of functions such as a facsimile function and a copy function.

As shown in FIG. 2, the recording device 100 includes a recording head 3 mounted on a carriage 2 and a platen 4 opposed to a lower surface of the recording head 3. A first guide member 5 and a second guide member 6 extend in a main scanning direction (Y-axis direction) of the carriage 2 and the carriage 2 reciprocates along them. The recording head 3 is mounted on the carriage 2 in such a manner that a nozzle 7 (refer to FIG. 5) is exposed so as to be opposed to the platen 4.

A sheet as a recording medium is transferred along a sub scanning direction (X-axis direction) perpendicular to the main scanning direction (Y-axis direction) of the carriage 2. The carriage 2 is moved reciprocally along the Y-axis direction by a timing belt 11 wound around a drive pulley 9 connected to a carriage (CR) motor 8 and a driven pulley 10.

As shown in FIG. 2, a housing part 14 for replaceable ink cartridges 13 is provided in a body frame 12 so that the ink cartridges 13 corresponding to ink colors (here, four cartridges for black ink, cyan ink, magenta ink, and yellow ink)

are housed. The ink of each ink cartridge 13 is supplied to the carriage 2 through a flexible ink supply tube (resin tube) 15 independently.

Figure 3:
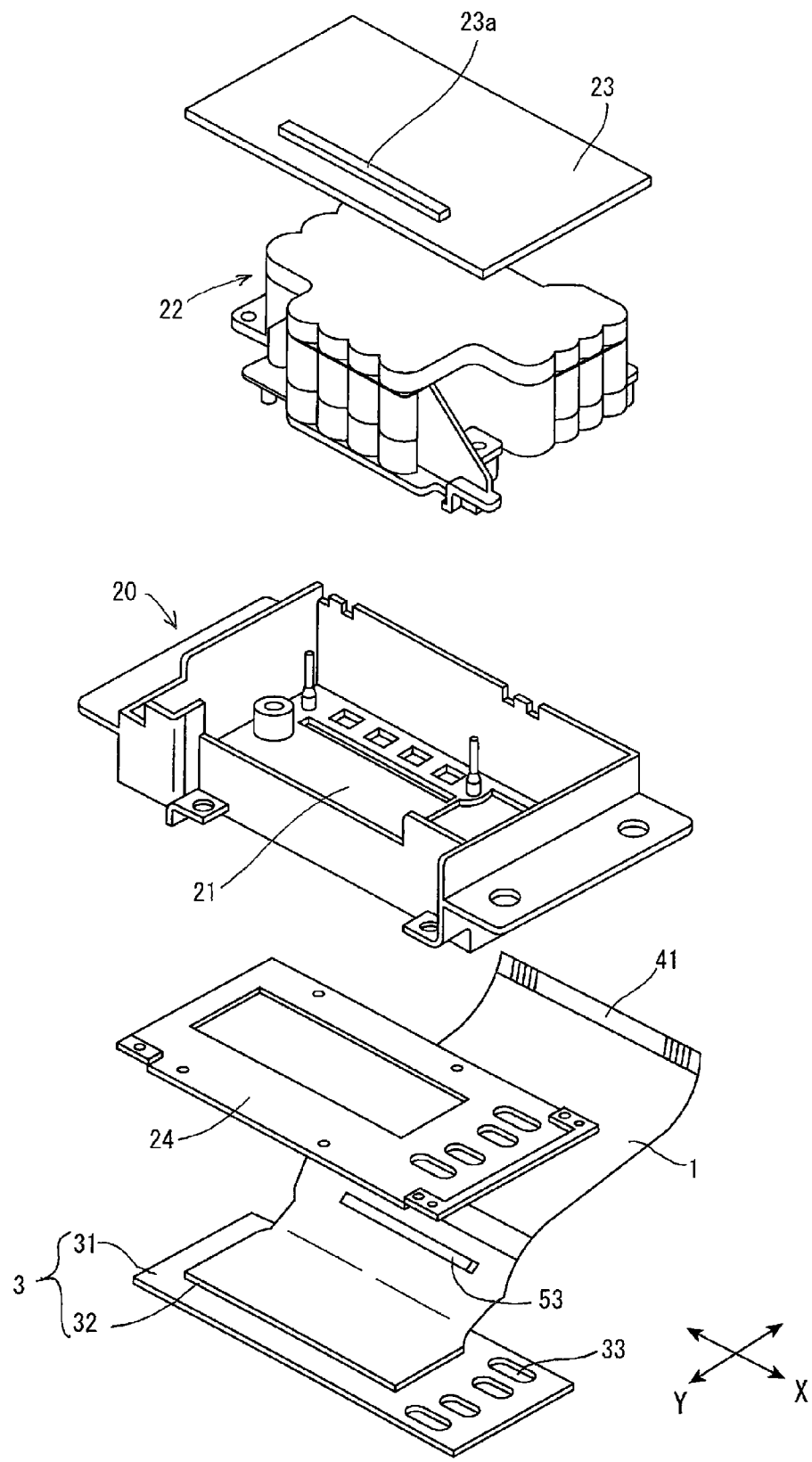
FIG. 3 is an exploded perspective view showing a carriage.

As shown in FIG. 3, the carriage 2 is provided with a roughly box-shaped head holder 20 having an opened upper surface, and the recording head 3 is fixed to a lower surface of a bottom plate 21 of the head holder 20 with a reinforcing frame 24 interposed. An ink storage part 22 in which ink supplied from the ink cartridge 13 is stored once, and a circuit substrate 23 are mounted on an upper surface side of the bottom plate 21 of the head holder 20. The circuit substrate 23 receives a drive signal from a control device (not shown) set in the body frame 12 through a flexible cable (not shown), and supplies the drive signal to an actuator 32 of the recording head 3 through the flexible wiring cable 1 connected to a connector 23*a* as will be described below.

Figure 5:
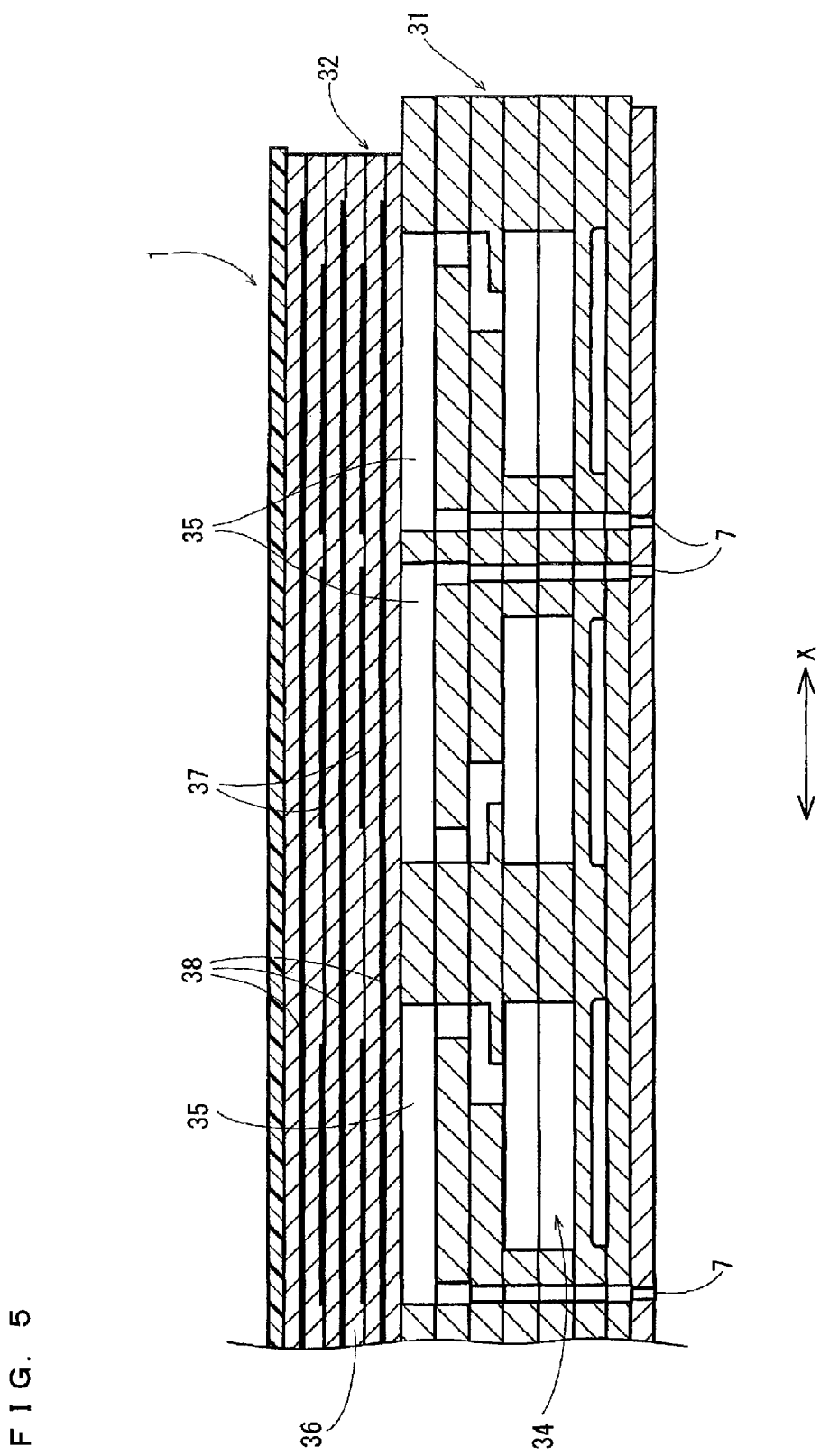
FIG. 5 is a longitudinal sectional view showing the recording head taken along X direction.

As shown in FIGS. 3, 4, and 5, according to the recording head 3, similar to Japanese Patent Application Laid-Open No. 2005-322850, a cavity part 31 having an open nozzle 7 on its lower side and a pressure chamber 35 on its upper side, and the plate-shaped actuator 32 are laminated. The cavity part 31 is formed by laminating a plurality of thin plates, and an ink supply path 34 to distribute the ink supplied from the ink storage part 22 to an ink inlet 33 of the cavity part 31 to each of the plurality of pressure chambers 35 is provided in its inside (refer to FIG. 5). The actuator 32 includes a plurality of flat ceramics layers 36 having a size covering all the pressure chambers 35 and laminated in a direction perpendicular to its flat shape direction, and a plurality of electrodes arranged among the plurality of ceramics layers 36.

The electrode includes an individual electrode 37 provided for each pressure chamber 35, and a common electrode 38 provided for the plurality of pressure chambers 35, and they are arranged alternately in the ceramics layers 36. As shown in FIG. 4, the actuator 32 includes an individual surface electrode 39*a* electrically connecting all the individual electrodes 37 in the laminated direction and introducing it to the surface, and a common surface electrode 39*b* electrically connecting all the common electrodes 38 in the laminated direction and introducing it to the surface, on its uppermost surface. In addition, the surface electrodes are not shown in FIG. 5.

According to the actuator 32 provided with the electrodes as described above, when a high voltage is applied between the individual electrode 37 and the common electrode 38, a part of the ceramics layer 36 sandwiched between both electrodes is polarized and functions as an active part as known heretofore. In addition, at the time of recording, when a voltage lower than that at the time of polarizing is applied, the active part is elongated and a pressure is applied to the ink in the corresponding pressure chamber 35, so that the ink can be discharged from the nozzle 7.

First Embodiment

Figure 6B:
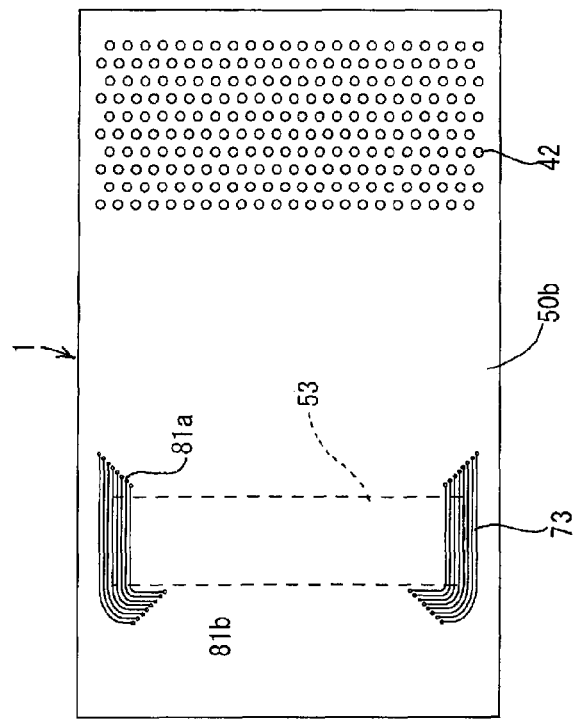
FIGS. 6A and 6B are top and bottom views showing a flexible wiring cable according to a first embodiment.

According to a flexible wiring cable 1, an output connection electrode 42 (refer to FIG. 6B) formed on a lower surface of its one end is opposed to the individual surface electrode 39*a* formed on the upper surface of the actuator 32 to be electrically connected. The flexible wiring cable 1 is elongated in the Y-axis direction from the actuator 32 (refer to FIGS. 3 and 4) and has an input connection electrode 41 to be connected to the circuit substrate 23, at its other end. In addition, the flexible wiring cable 1 may be formed of one wiring member extending in succession from the input connection electrode 41 to the output connection electrode 42 or may be formed of a plurality of wiring members connected in the longitudinal direction.

Figure 6A:
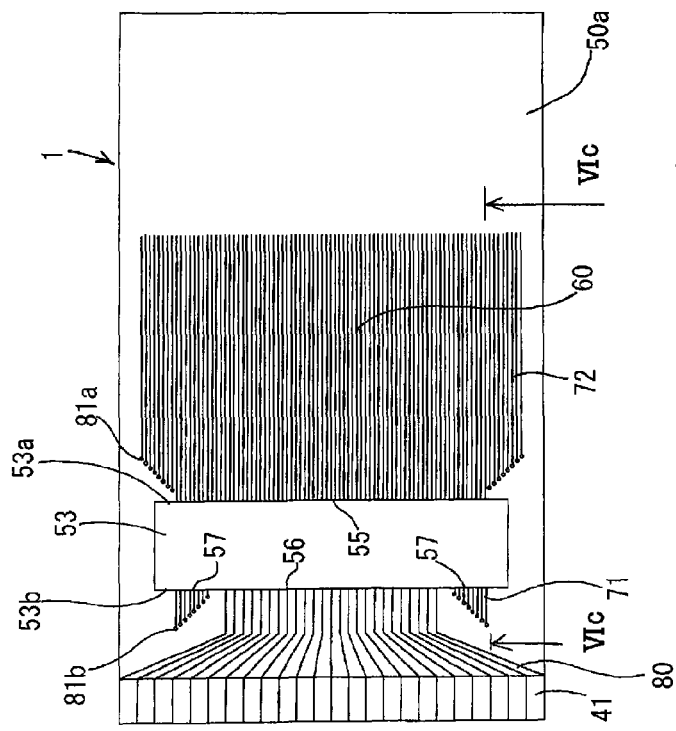
Figure 6C:
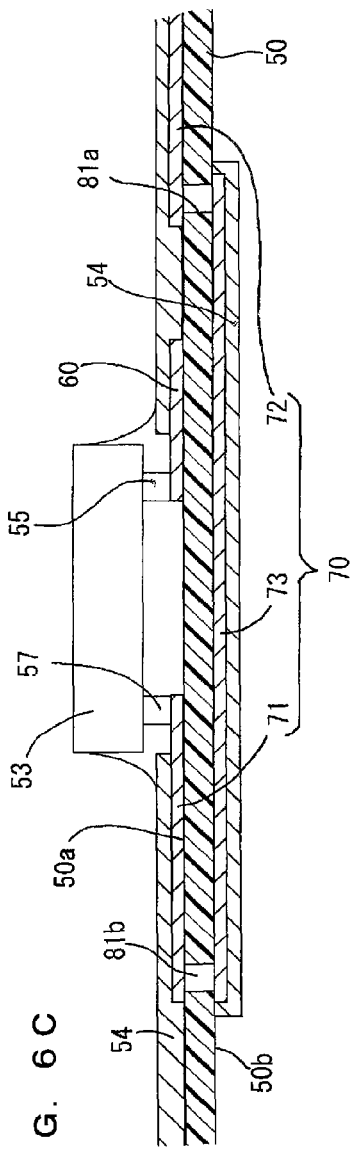
FIG. 6C is a sectional view taken along line VIc-VIc of FIG. 6A.

As shown in FIG. 6C, according to the flexible wiring cable 1, a circuit element 53, and leads 60, 70, and 80 are arranged on a flexible flat base (polyimide or the like) 50 and the leads 60, 70 and 80 are covered with an insulation layer (resist or the like) 54.

The circuit element 53 converts a drive signal transmitted serially from the circuit substrate 23 through the input lead 80, to a parallel drive signal corresponding to a plurality of individual surface electrodes 39*a*, and outputs it to the plurality of individual surface electrodes 39*a* through the output leads 60 and 70 as a voltage suitable for driving the active part. The common surface electrode 39*b* is connected to the ground potential.

As shown in FIG. 6A, the circuit element 53 has a rectangular shape in plan view and it is arranged on an upper surface 50*a* of the base 50 so that two long sides 53*a* and 53*b* of the circuit element 53 may be perpendicular to the elongated direction (Y direction) of the flexible wiring cable 1. In the circuit element 53, a plurality of first output terminals 55 are provided along the long side 53*a* that is closer to the output connection electrode 42, and a plurality of input terminals 56 are provided at the center of the opposite long side 53*b* and a plurality of second output terminals 57 are provided at both ends thereof along the long side 53*b*. That is, the output terminals 55 and 57 outputting the drive signal for the active part are separately provided on the two sides.

The leads include the first output lead 60 extending from the first output terminal 55 to the output connection electrode 42, the second output lead 70 extending from the second output terminal 57 to the output connection electrode 42, and the input lead 80 extending from the input connection electrode 41 to the input terminal 56. The first output lead 60 and the input lead 80 are printed on the upper surface 50*a* of the base 50. The second output lead 70 includes first parts 71 and 72 printed on the upper surface 50*a* of the base 50, and a second part 73 printed on the lower surface 50*b* of the base 50 to circumvent the circuit element 53.

The second output lead 70 includes the first upstream part 71 extending from the second output terminal 57 of the circuit element 53 toward the input connection electrode 41 (without any connection), the first downstream part 72 extending in parallel with the first output lead 60 and connected to the output connection electrode 42, and the second part 73 passing on the side of the lower surface 50*b*. The second part 73 on the lower surface 50*b*, and the first parts 72 and 71 on the upper surface 50*a* are electrically connected by conductive materials 81*a* and 81*b* filled in a penetration hole formed in the base 50 on both long sides 53*a* and 53*b* of the circuit element 53. That is, the second output terminal 57 is connected to the first upstream part 71 on the upper surface 50*a*, the conductive material 81*b*, the second part 73 on the lower surface 50*b*, and the conductive material 81*a*, and finally to the first downstream part 72 on the upper surface 50*a*.

Thus, since the second output lead 70 extending from the second output terminal 57 is arranged so as to pass the opposite side of the circuit element 53 of the base 50 at its middle part (second part 73), the second output lead 70 can be wired so as to circumvent the circuit element 53 without expanding the width of the base 50, that is, increasing a plane area thereof. As a result, even when the flexible wiring cable 1 has many output terminals, it can be compactly provided as a whole, so that no inconvenience is caused at the time of wiring.

The output connection electrode 42 is formed by exposing each end of the first output lead 60 and each end of the first downstream part 72 of the second output lead 70 from an opening (not shown) penetrating the base 50 to the lower surface 50b. The exposed end is connected to the individual surface electrode 39a through a well-known solder bump, conductive bonding agent and the like.

The terminals 56, 55 and 57 of the circuit element 53 are opposed to exposed parts of the input lead 80, the first output lead 60, the first upstream part 71 of the second output lead 70 and connected to them, respectively through a solder bump, a conductive bonding agent and the like after the insulation layer 54 has been partially removed.

In addition, the common surface electrode 39b of the actuator 32 is connected to the input connection electrode 41 through a lead (not shown) formed along both side edges of the base 50 in parallel with the elongated direction (Y direction).

Next, second to fourth embodiments providing the same effect as the first embodiment will be described. In addition, the same references are allotted to the same components as in the first embodiment and a detailed description of them will be omitted.

Second Embodiment

According to a flexible wiring cable 101 shown in FIGS. 7A to 7C in the second embodiment, a second part 73 of a second output lead 70 is formed on an auxiliary base 150 that is different from a base 50. As a matter of course, a plane area of the auxiliary base 150 is designed so that the plane area of the auxiliary base 150 is not larger than that of the base 50 in a state firmly fixed to the base 50.

The auxiliary base 150 is formed of a resin (polyimide or the like) similar to the base 50, and a lead serving as the second part 73 of the second output lead 70 is printed on one surface of it. Meanwhile, connection parts 83 and 83 opposed to the second part 73 are formed on lower surfaces of conductive materials 81a and 81b by a solder or the like. Thus, the auxiliary base 150 is arranged so as to be opposed to the lower surface 50b of the base 50, and the conductive materials 81a and 81b and both ends of the second part 73 are electrically connected, and the auxiliary base 150 is fixed to the base 50.

Thus, the second output lead 70 extending from a second output terminal 57 is wired so as to pass the opposite side of the circuit element 53 of the base 50 in its middle part (second part 73).

According to the second embodiment, since wiring is performed on one surface of the base 50 and the auxiliary base 150, cost of the wiring member can be reduced as compared with the case where the wiring member wired on both surfaces is partially used like the first embodiment.

Third Embodiment

Next, a third embodiment will be described with reference to FIGS. 8A to 8C. Although the auxiliary base 150 of the second embodiment is different from the base 50, according to a flexible wiring cable 201 in the third embodiment, an auxiliary base 250 is formed in succession to the base 50 as a part of the base 50.

The auxiliary base 250 is a region extended from an outer region of a short side of a circuit element 53 on the base 50 in a width direction of the base 50, and bent toward the lower surface 50b of the base 50. Since the auxiliary base 250 is bent along a bending line 85, the width of the base 50 is the same between the portion having the auxiliary base 250 and the portion not having the auxiliary base 250. Thus, the plane area of the base 50 is not increased even when the auxiliary base 250 is provided.

A lead serving as a second part 73 of a second output lead 70 is previously printed on the surface of the auxiliary base 250 to be opposed to the lower surface 50b of the base 50. Thus, similar to the second embodiment, connection parts 83 and 83 formed on the lower surface side of conductive materials 81a and 81b and both ends of the second part 73 of the auxiliary base 250 are electrically connected, respectively, whereby the auxiliary base 250 is fixed to the base 50.

According to the third embodiment, as shown in FIG. 8A, before the auxiliary base 250 is bent, the first parts 71 and 72 of the second output lead 70 are formed on the upper surface 50a of the base 50 and then the second part 73 of the second output lead 70 is formed on the lower surface of the region that will be the auxiliary base 250 later. That is, before the auxiliary base 250 is bent, the first parts 71 and 72 and the second part 73 is not connected, the second output lead 70 does not cross the bending line 85. Thus, even when the auxiliary base 250 is bent, since the second output lead 70 is not bent, breaking or the like does not occur.

Fourth Embodiment

Next, a fourth embodiment will be described with reference to FIGS. 9A to 9C. According to a flexible wiring cable 301 of the fourth embodiment, although a part of a base 50 serving as an auxiliary base 350 is similar to the third embodiment, it is different from the third embodiment in that first parts 71 and 72 of a second output lead 70 provided on the base 50 and a second part 73 thereof provided on the auxiliary base 350 are continuously printed.

The auxiliary base 350 is a region extended from an outer region of a short side of the circuit element 53 on the base 50 in a width direction of the base 50, and bent toward the lower surface 50b of the base 50. Since the auxiliary base 350 is bent along a bending line 85, the width of the base 50 is the same between the portion having the auxiliary base 350 and the portion not having the auxiliary base 350. Thus, the plane area of the base 50 is not increased even when the auxiliary base 350 is provided.

According to the fourth embodiment, as shown in FIG. 9A, before the auxiliary base 350 is bent, the first parts 71 and 72 of the second output lead 70 are formed on the upper surface 50a of the base 50 and then the second part 73 thereof is formed on the upper surface of the region that will be the auxiliary base 350 later. That is, before the auxiliary base 350 is bent, the first parts 71 and 72 and the second part 73 are continuously formed, and the second output lead 70 crosses the bending line 85. Thus, since the auxiliary base 350 is bent toward the lower surface 50b of the base 50 and fixed, the second part 73 of the second output lead 70 is arranged on the opposite side of the surface where the auxiliary base 350 is opposed to the base 50 (refer to FIG. 9B and FIG. 9C).

Thus, according to the fourth embodiment, it is not necessary to provide the conductive materials 81a and 81b in the base 50 unlike the first to third embodiments, so that the connecting process between the first parts 71 and 72 and the second part 73 is not necessary.

The flexible wiring cable on which the circuit element is mounted is applied not only the recording head 3 of the recording device 100 in the above embodiment but also applied to another device such as a liquid crystal display device.

In addition, although the second output lead 70 is arranged at both ends of the circuit element 53 in the above each embodiment, it may be arranged at one end only. Furthermore, although the first output lead 60, the first parts 71 and 72 of the second output lead 70, and the input lead 80 are formed on the upper surface 50a of the base 50, they may be formed on the lower surface 50b and the circuit element 53 may be arranged on the upper surface 50a of the base 50 so that the circuit element 53 and each lead are connected through an opening penetrating the base 50. The first part 71 extending from the second output terminal 57 of the circuit element 53 may be omitted and the second output terminal 57 may be directly connected to the first part 72.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A flexible wiring cable having a plurality of leads in the form of a plane, a circuit element mounted on the leads, an input connection electrode formed on one end of the flexible wiring cable, and an output connection electrode formed on another end of the flexible wiring cable,
    wherein a plurality of first output terminals are provided along a first side of the circuit element, and a plurality of input terminals and a plurality of second output terminals are adjacently provided along a second side of the circuit element,
    wherein the a first side of the circuit element is on a same side of the circuit element as the output connection electrode, and
        wherein the second side of the circuit element is on a same side of the circuit element as the input connection electrode,
    wherein the plurality of leads comprise a first output lead extending from one first output terminal of the plurality of first output terminals to the output connection electrode, a second output lead extending from one second output terminal of the plurality of second output terminals to the output connection electrode, and an input lead extending from the input connection electrode to one input terminal of the plurality of input terminals,
    wherein the second output lead extends from the second side of the circuit element to the first side of the circuit element, and the second output lead further extends from the first side of the circuit element to the output connection electrode,
    wherein at least a portion of the second output lead extends in a direction parallel to a direction in which the first output lead extends,
    wherein the input lead, the first output lead, and the circuit element are provided on a first surface of the flexible wiring cable,
    wherein the second output lead comprises:
        a terminal part extending from the one second output terminal of the circuit element on the first surface of the flexible wiring cable,
        a first base part positioned on a same surface of the flexible wiring cable as the first output lead and connected to the output connection electrode, and
        a second base part disposed on a second surface of the flexible wiring cable,
        wherein the second surface of the flexible wiring cable is a surface of the flexible wiring cable opposite the first surface of the flexible wiring cable on which the circuit element is provided,
    wherein a conductive material penetrating the flexible wiring cable is provided at both the first side of the circuit element and the second side of the circuit element,
    wherein the second base part of the second output lead is formed on an auxiliary base fixed on the second surface of the flexible wiring cable, and the auxiliary base is fixed on the second surface of the flexible wiring cable such that the second base part of the second output lead is connected to the penetrating conductive material, and
    wherein the auxiliary base is formed integrally in succession on the first surface of the flexible wiring cable and bent and fixed to the second surface of the flexible wiring cable.

2. The flexible wiring cable according to claim 1, wherein the input terminals are arranged almost at the center of the second side of the circuit element, and the second output terminals are arranged at the both sides of the input terminals on the second side of the circuit element.

3. The flexible wiring cable according to claim 1, wherein when the auxiliary base is bent, a width of the flexible flat base at a portion having the auxiliary base is almost the same as that at a portion not having the auxiliary base.

4. The flexible wiring cable according to claim 1, wherein the output connection electrode is connected to an actuator of a recording head performing a recording operation by selective drive of the actuator.

* * * * *